(12) United States Patent
Jeong et al.

(10) Patent No.: US 12,514,100 B2
(45) Date of Patent: Dec. 30, 2025

(54) DISPLAY APPARATUS

(71) Applicant: SAMSUNG DISPLAY CO., LTD., Yongin-si (KR)

(72) Inventors: Seungyeon Jeong, Yongin-si (KR); Ohjeong Kwon, Yongin-si (KR); Hongyeon Lee, Yongin-si (KR); Hyeoji Kang, Yongin-si (KR); Kyeongjong Kim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 359 days.

(21) Appl. No.: 17/524,110

(22) Filed: Nov. 11, 2021

(65) Prior Publication Data

US 2022/0293890 A1  Sep. 15, 2022

(30) Foreign Application Priority Data

Mar. 15, 2021 (KR) .................. 10-2021-0033455

(51) Int. Cl.
*H10K 59/80* (2023.01)
*H10K 59/40* (2023.01)

(52) U.S. Cl.
CPC ......... *H10K 59/8792* (2023.02); *H10K 59/40* (2023.02); *H10K 59/873* (2023.02)

(58) Field of Classification Search
CPC .......... H10K 50/86–865; H10K 50/844–8445; H10K 59/124; H10K 59/8791–8792; H10K 50/818; H10K 50/824–828; H01L 23/552–556; H10H 29/37; H10H 29/8552
See application file for complete search history.

(56) References Cited

U.S. PATENT DOCUMENTS

| | | | |
|---|---|---|---|
| 9,203,049 B2 | 12/2015 | Lee et al. | |
| 9,985,252 B2 | 5/2018 | Lee et al. | |
| 10,243,031 B2 | 3/2019 | Lee et al. | |
| 2011/0025199 A1* | 2/2011 | Park | H10K 50/865 313/504 |
| 2014/0077183 A1* | 3/2014 | Lee | H10K 50/844 257/40 |
| 2016/0079567 A1* | 3/2016 | Cho | H10K 59/8792 257/40 |
| 2018/0151842 A1* | 5/2018 | Park | H10K 50/8428 |
| 2018/0182814 A1* | 6/2018 | Kim | H10K 59/8792 |
| 2020/0152919 A1* | 5/2020 | Joo | H10K 50/865 |
| 2020/0212122 A1* | 7/2020 | Asaoka | H10K 59/00 |
| 2020/0295310 A1* | 9/2020 | Moon | H10K 59/1315 |

FOREIGN PATENT DOCUMENTS

| | | | |
|---|---|---|---|
| KR | 101481673 B1 | 1/2015 | |
| KR | 101620092 B1 | 5/2016 | |
| KR | 1020180027706 A | 3/2018 | |
| KR | 101954220 B1 | 2/2019 | |

* cited by examiner

*Primary Examiner* — Julio J Maldonado
*Assistant Examiner* — Eric Manuel Mulero Flores
(74) *Attorney, Agent, or Firm* — CANTOR COLBURN LLP

(57) ABSTRACT

A display apparatus includes a substrate, a display element on the substrate, a low-reflection inorganic layer on the display element, a light blocking layer on the low-reflection inorganic layer and defining an opening corresponding to an emission area of the display element, and a reflection control layer filling the opening of the light blocking layer. The light blocking layer includes a first light blocking layer and a second light blocking layer having different light absorption wavelength spectra from each other.

17 Claims, 13 Drawing Sheets

DISPLAY APPARATUS

This application claims priority to Korean Patent Application No. 10-2021-0033455, filed on Mar. 15, 2021, and all the benefits accruing therefrom under 35 U.S.C. § 119, the content of which in its entirety is herein incorporated by reference.

BACKGROUND

1. Field

Embodiments relate to a display apparatus.

2. Description of the Related Art

Recently, a usage of display apparatuses has diversified. Also, the display apparatuses are becoming thinner and more lightweight, and thus, the use of the display apparatuses is expanding. As display apparatuses are used in various fields, a demand for the display apparatuses that provide high-quality images is increasing.

SUMMARY

Embodiments include a display apparatus in which light efficiency and visibility are improved to provide high-quality images. However, this is merely an example, and the scope of the invention is not limited thereby.

Additional features will be set forth in part in the description which follows and, in part, will be apparent from the description, or may be learned by practice of the presented embodiments of the invention.

In an embodiment of the invention, a display apparatus includes a substrate, a display element on the substrate, a low-reflection inorganic layer on the display element, a light blocking layer on the low-reflection inorganic layer and defining an opening corresponding to an emission area of the display element, and a reflection control layer filling the openings of the light blocking layer. The light blocking includes a first light blocking layer and a second light blocking layer having different light absorption wavelength spectra from each other.

In an embodiment, the second light blocking layer may include a material that absorbs a wavelength in a band of about 380 nanometers (nm) to about 500 nm.

In an embodiment, the first light blocking layer may be provided in black, and the second light blocking layer may be provided in yellow.

In an embodiment, the second light blocking layer may cover at least a portion of a side surface of the opening of the first light blocking layer.

In an embodiment, the reflection control layer may selectively absorb a first wavelength band and a second wavelength band of a visible light band.

In an embodiment, the first wavelength band may be about 480 nm to about 505 nm, and the second wavelength band may be about 585 nm to about 605 nm.

In an embodiment, the display apparatus may further include a pixel defining layer covering an edge of a pixel electrode of the display element and defining an opening exposing a central portion of the pixel electrode, where the pixel defining layer may include a light blocking material.

In an embodiment, the display apparatus may further include a pixel defining layer covering an edge of a pixel electrode of the display element and defining an opening exposing a central portion of the pixel electrode, where a width of the opening of the light blocking layer may be greater than a width of the opening of the pixel defining layer.

In an embodiment, the low-reflection inorganic layer may include at least one of ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), and germanium (Ge).

In an embodiment, the reflection control layer may include at least one of a dye and a pigment.

In an embodiment, the display apparatus may further include a capping layer between the display element and the low-reflection inorganic layer.

In an embodiment, the display apparatus may further include a thin-film encapsulation layer on the low-reflection inorganic layer, and a touch sensing layer on the thin-film encapsulation layer, wherein the light blocking layer may be on the touch sensing layer.

In an embodiment of the invention, a display apparatus includes a substrate, a first display element, a second display element, and a third display element on a substrate and emitting light of different colors from each other, a low-reflection inorganic layer commonly arranged on the first display element, the second display element, and the third display element, a light blocking layer on the low-reflection inorganic layer and defining openings respectively corresponding to emission areas of the first display element, the second display element, and the third display element, and a reflection control layer filling the opening of the light blocking layer and commonly arranged on the first display element, the second display element, and the third display element. The light blocking layer includes a first light blocking layer and a second light blocking layer having different light absorption wavelength spectra from each other.

In an embodiment, the first light blocking layer may be provided in black, and the second light blocking layer may be provided in yellow.

In an embodiment, the reflection control layer may selectively absorb a first wavelength band and a second wavelength band of a visible light band.

In an embodiment, the first wavelength band may be about 480 nm to about 505 nm, and the second wavelength band may be about 585 nm to about 605 nm.

In an embodiment, the display apparatus may further include a pixel defining layer covering edges of pixel electrodes of the first display element, the second display element, and the third display element and defining an opening exposing a central portion of the pixel electrode, wherein the pixel defining layer may include a light blocking material.

In an embodiment, the low-reflection inorganic layer may include at least one of ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), and germanium (Ge).

In an embodiment, the reflection control layer may include at least one of a dye and a pigment.

In an embodiment, the display apparatus may further include a thin-film encapsulation layer on the low-reflection inorganic layer, and a touch sensing layer on the thin-film encapsulation layer, wherein the light blocking layer may be on the touch sensing layer.

BRIEF DESCRIPTION OF THE DRAWINGS

The above and other embodiments, features, and advantages of the invention will be more apparent from the following description taken in conjunction with the accompanying drawings, in which.

DETAILED DESCRIPTION

Figure 1:
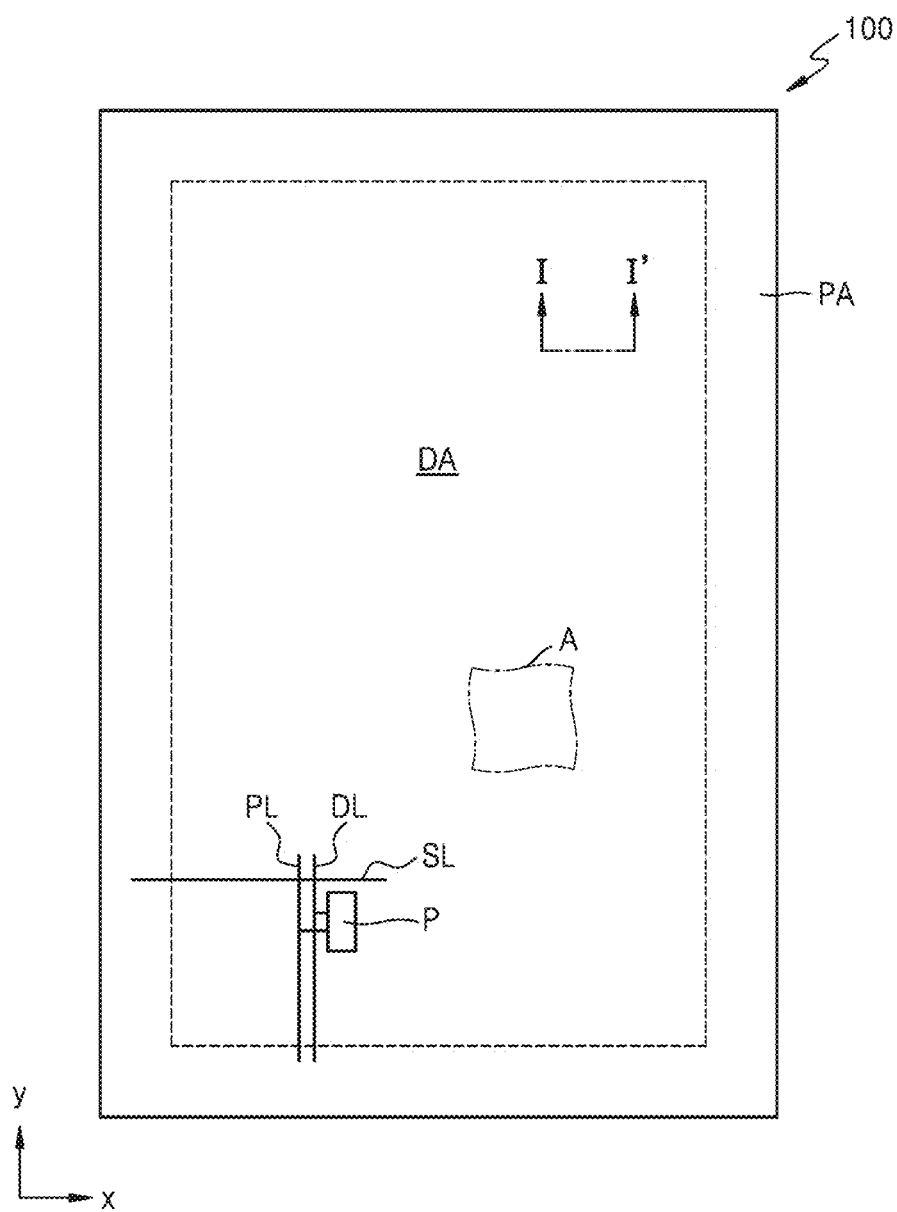
FIG. 1 is a schematic plan view of a display apparatus.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the invention, the expression "at least one of a, b or c" indicates only a, only b, only c, both a and b, both a and c, both b and c, all of a, b, and c, or variations thereof.

As the description allows for various changes and numerous embodiments, certain embodiments will be illustrated in the drawings and described in detail in the written description. Effects and features of the invention, and methods of achieving them will be clarified with reference to embodiments described below in detail with reference to the drawings. However, the invention is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the invention is not limited thereto.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

In the following embodiments, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

In this specification, the expression "A and/or B" indicates only A, only B, or both A and B.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a schematic plan view of an embodiment of a display apparatus.

Referring to FIG. 1, a substrate 100 of the display apparatus may be divided into a display area DA and a peripheral area PA around the display area DA. The display apparatus may provide a predetermined image by light emitted from a plurality of pixels P in the display area DA.

In an embodiment, each of the pixels P may include a display element, such as an organic light-emitting diode or an inorganic light-emitting diode, and may emit red light, green light, blue light, or white light. That is, each of the pixels P may be connected to a pixel circuit including a thin-film transistor (refer to TFT in FIG. 5), a storage capacitor, or the like. The pixel circuit (refer to PC in FIG. 2) may be connected to a scan line SL, a data line DL crossing the scan line SL, and a driving voltage line PL. The scan line SL may extend in the x direction, and the data line DL and the driving voltage line PL may extend in the y direction.

The pixels P may emit light by the driving of the pixel circuit, and the display area DA may provide a predetermined image through light emitted from the pixels P. In the specification, the pixel P may be defined as an emission area that emits light of any one of red, green, blue, and white colors, as described above.

The peripheral area PA is an area in which the pixels P are not arranged, and does not provide an image. A terminal part, to which a printed circuit board or a driver integrated circuit ("IC") including a power supply line, a driving circuit, and an internal driving circuit which drives the pixels P is connected, may be arranged in the peripheral area PA.

In an embodiment, the display apparatus may include an organic light-emitting display, an inorganic light-emitting display (or an inorganic electroluminescence ("EL") display), a quantum dot display, or the like. Hereinafter, an organic light-emitting display apparatus will be described as an embodiment of the display apparatus, but the invention is not limited thereto. The features to be described later may be applied to various types of display apparatuses as described above.

Figure 2:
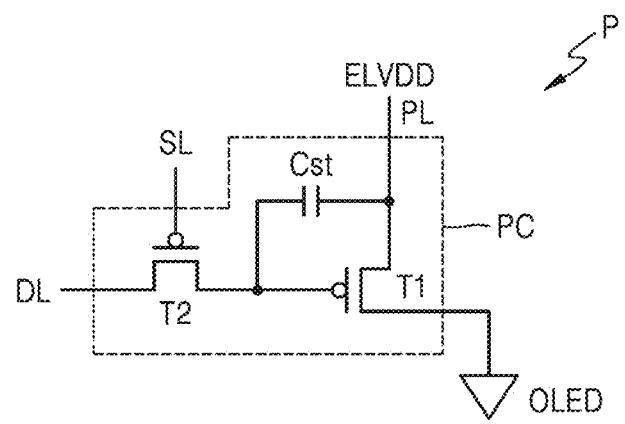
FIG. 2 illustrates an embodiment of a display element provided in a pixel of a display apparatus and a pixel circuit connected thereto.

FIG. 2 illustrates an embodiment of a display element provided in a pixel of a display apparatus and a pixel circuit connected thereto.

Referring to FIG. 2, an organic light-emitting diode OLED, which is a display element, is connected to a pixel circuit PC. The pixel circuit PC may include a first thin-film transistor T1, a second thin-film transistor T2, and a storage capacitor Cst. In an embodiment, the organic light-emitting diode OLED may emit red light, green light, or blue light, or may emit red light, green light, blue light, or white light, for example.

The second thin-film transistor T2, which acts as a switching thin-film transistor, may be connected to a scan line SL and a data line DL and transmit a data voltage input from the data line DL to the first thin-film transistor T1 according to a switching voltage input from the scan line SL. The storage capacitor Cst may be connected to the second thin-film transistor T2 and a driving voltage line PL and store a voltage corresponding to a difference between a voltage received from the second thin-film transistor T2 and a first power supply voltage ELVDD supplied to the driving voltage line PL.

The first thin-film transistor T1, which acts as a driving thin-film transistor, may be connected to the driving voltage line PL and the storage capacitor Cst and control a driving current flowing from the driving voltage line PL to the organic light-emitting diode OLED in response to a voltage value stored in the storage capacitor Cst. The organic light-emitting diode OLED may emit light having a predetermined luminance according to the driving current. An opposite electrode (e.g., a cathode) of the organic light-emitting diode OLED may receive a second power supply voltage ELVSS. In an embodiment, a voltage level of the second power supply voltage ELVSS may be lower than that of the first power supply voltage ELVDD. In an alternative embodiment, the opposite electrode (e.g., a cathode) of the organic light-emitting diode OLED may be connected to ground to receive a voltage of 0 volt.

FIG. 2 illustrates that the pixel circuit PC includes two thin-film transistor s and one storage capacitor, but in another embodiment, the number of thin-film transistor s or the number of storage capacitors may be variously changed according to the design of the pixel circuit PC.

Figure 3:
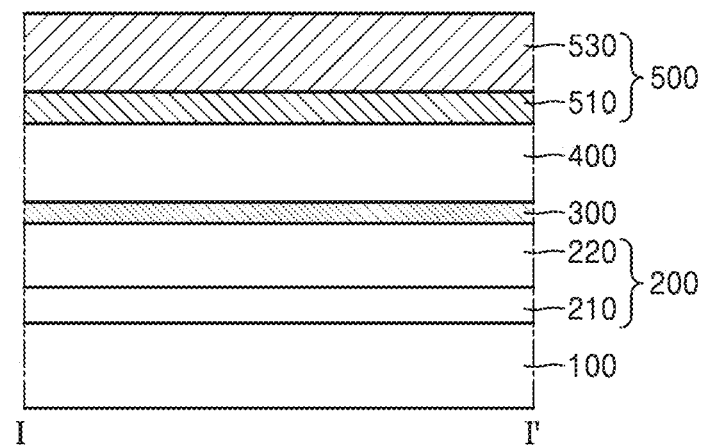
FIG. 3 is a schematic cross-sectional view of an embodiment of the display apparatus taken along line I-I' of FIG. 1.

FIG. 3 is a schematic cross-sectional view of an embodiment of the display apparatus taken along line I-I' of FIG. 1.

Referring to FIG. 3, in the display apparatus in the embodiment, a display layer 200 may be on a substrate 100, and a low-reflection inorganic layer 300, a thin-film encapsulation layer 400, and an anti-reflective layer 500 may be on the display layer 200.

The substrate 100 may include a polymer resin or a glass material. The substrate 100 including the polymer resin may be flexible, rollable, or bendable. The display layer 200 may include a display element layer 220 including a plurality of display elements, and a pixel circuit layer 210 including pixel circuits respectively connected to the display elements. Each of the display elements provided in the display element layer 220 may define a pixel, and the pixel circuit layer 210 may include a plurality of transistors and a plurality of storage capacitors.

The low-reflection inorganic layer 300 is on the display layer 200. The low-reflection inorganic layer 300 may absorb light reflected by metals arranged inside the display apparatus, for example, inside the display layer 200. In an alternative embodiment, the low-reflection inorganic layer 300 may reduce the reflectance of external light by absorbing light incident from the outside of the display apparatus. The low-reflection inorganic layer 300 may include an inorganic material having a low reflectance.

The thin-film encapsulation layer 400 may be on the low-reflection inorganic layer 300. The thin-film encapsulation layer 400 may prevent the display elements from being damaged by foreign matter such as moisture. The thin-film encapsulation layer 400 may include at least one inorganic thin-film encapsulation layer and at least one organic thin-film encapsulation layer.

The anti-reflective layer 500 may be on the thin-film encapsulation layer 400. The anti-reflective layer 500 may reduce the reflectance of light (external light) incident from the outside toward the display apparatus. In the illustrated embodiment, the anti-reflective layer 500 may include a light blocking layer 510 including a black matrix, and a reflection control layer 530. The reflection control layer 530 may include a dye and/or a pigment and may absorb light in a predetermined wavelength band.

A cover window may be on the anti-reflective layer 500. In an embodiment, the cover window may be attached on the anti-reflective layer 500 by a transparent adhesive member such as an optically clear adhesive film.

Figure 4A:
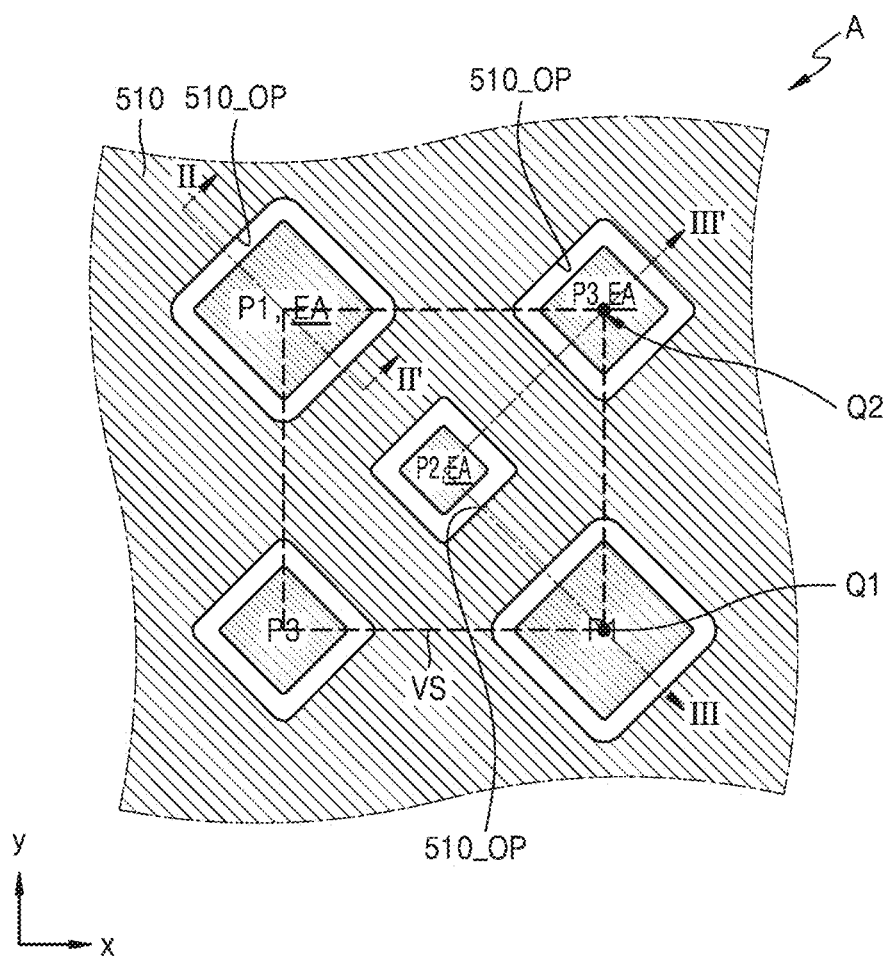
FIGS. 4A and 4B are an enlarged plan view of an embodiment of a partial configuration included in region A of FIG. 1.
Figure 4B:
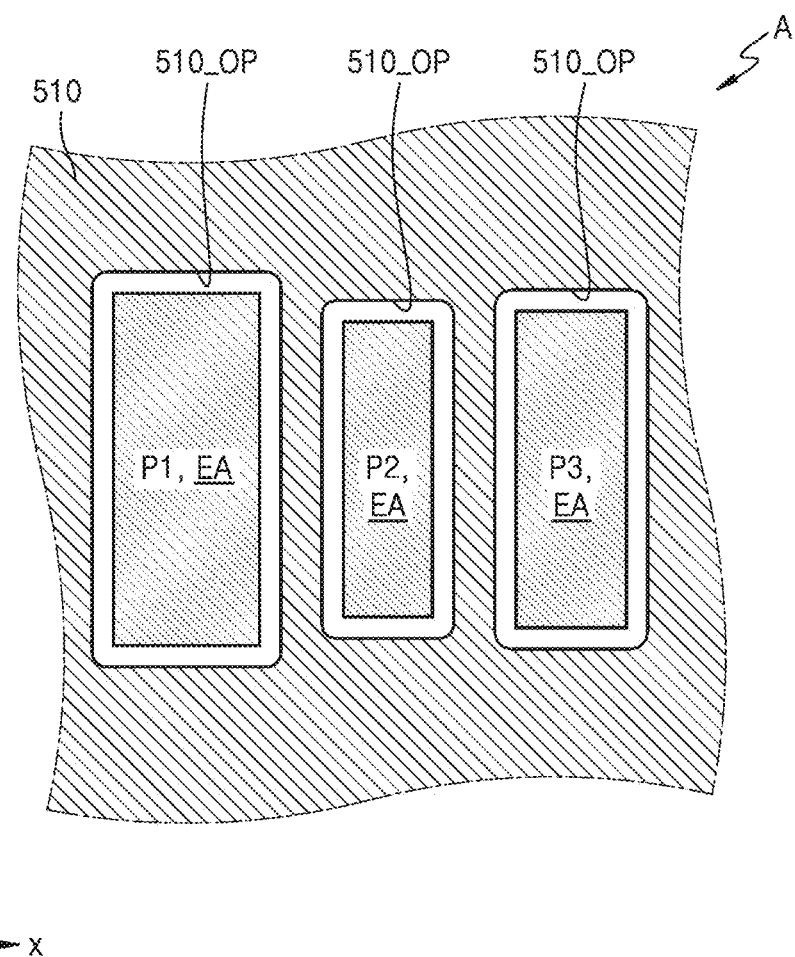

FIGS. 4A and 4B are an enlarged plan view of an embodiment of a partial configuration included in region A of FIG. 1. FIGS. 4A and 4B schematically illustrate an arrangement relationship between a plurality of pixels and openings 510_OP of a light blocking layer 510 arranged to correspond to an emission area EA of each pixel.

Referring to FIGS. 4A and 4B, the display apparatus may include a plurality of pixels. The pixels may include a first pixel P1, a second pixel P2, and a third pixel P3, which emit light of different colors from each other. In an embodiment, the first pixel P1 may emit blue light, the second pixel P2 may emit green light, and the third pixel P3 may emit red light, for example. However, the invention is not limited thereto. Various modifications may be made thereto. In an embodiment, the first pixel P1 may emit red light, the second pixel P2 may emit green light, and the third pixel P3 may emit blue light, for example.

The first pixel P1, the second pixel P2, and the third pixel P3 may have a quadrangular shape among polygonal shapes. In the specification, polygons or quadrangles include a shape in which vertices are round. That is, the first pixel P1, the second pixel P2, and the third pixel P3 may have a quadrangular shape in which vertices are round. In another embodiment, the first pixel P1, the second pixel P2, and the third pixel P3 may have a circular shape or an elliptical shape.

The first pixel P1, the second pixel P2, and the third pixel P3 may have different sizes from each other. In an embodiment, the area of the second pixel P2 may be less than the area of the first pixel P1 and the area of the third pixel P3, and the area of the first pixel P1 may be greater than the area of the third pixel P3, for example. However, the invention is not limited thereto. The areas of the first pixel P1, the second pixel P2, and the third pixel P3 may be variously modified. In an embodiment, the areas of the first pixel P1, the second pixel P2, and the third pixel P3 may be substantially the same as each other, for example.

Figure 5:
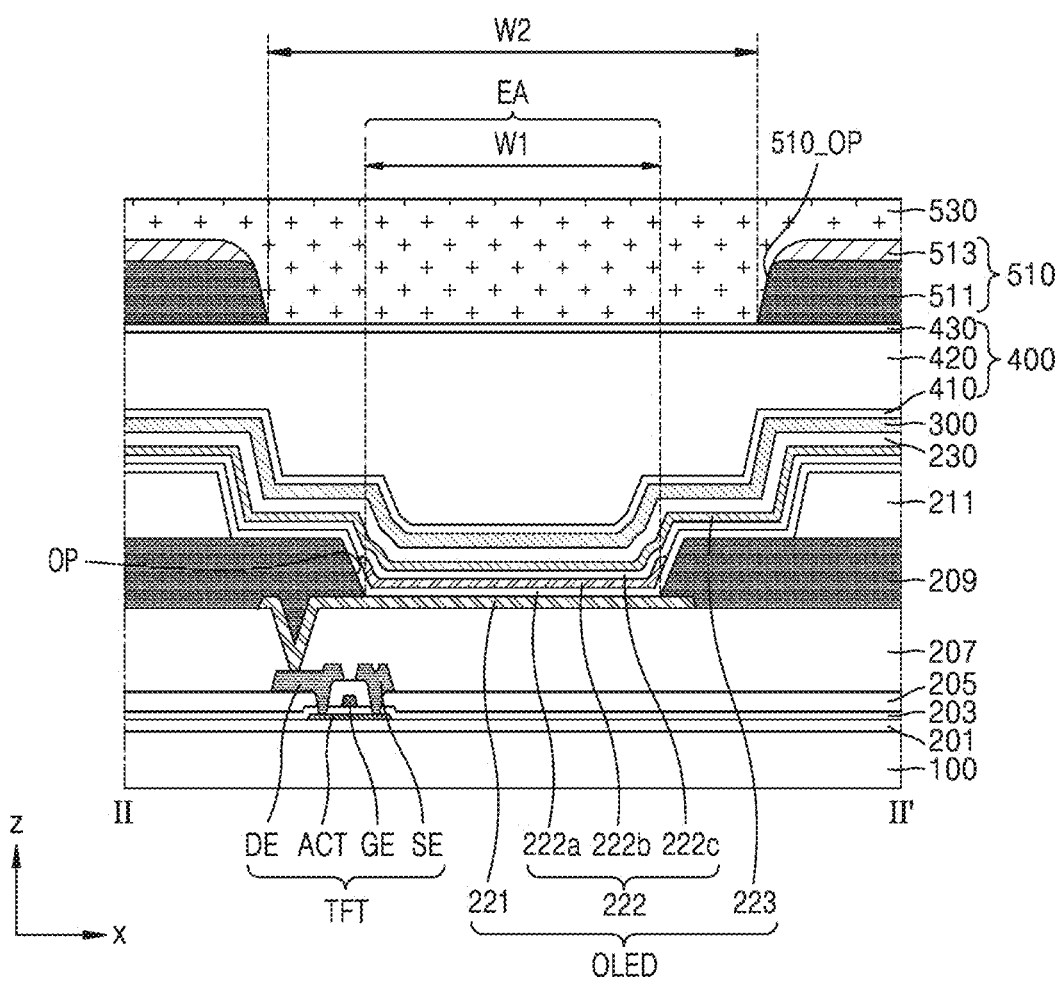
FIG. 5 is a schematic cross-sectional view of an embodiment of the display apparatus taken along line II-II' of FIG. 4A.

In the specification, the sizes of the first pixel P1, the second pixel P2, and the third pixel P3 may refer to the sizes of the emission areas EA of the display elements implementing the pixels, and the emission areas EA may be defined by openings OP (refer to FIG. 5) of a pixel defining layer (refer to 209 of FIG. 5).

Openings 510_OP respectively corresponding to the pixels may be defined in the light blocking layer 510 on the display element layer. The opening 510_OP is defined by removing a portion of the light blocking layer 510, and light emitted from the display element may be emitted to the outside through the opening 510_OP. A body of the light blocking layer 510 may include a material that absorbs external light, and thus, the visibility of the display apparatus may be improved.

In a plan view, the openings 510_OP of the light blocking layer 510 may be arranged to surround the pixels P1, P2, and P3. In an embodiment, the opening 510_OP of the light blocking layer 510 may have a quadrangular shape with round corners. The areas of the openings 510_OP of the light blocking layer 510 corresponding to the pixels P1, P2, and P3 may be greater than the areas of the pixels P1, P2, and P3. However, the invention is not limited thereto. The areas of the openings 510_OP of the light blocking layer 510 may be substantially the same as the areas of the pixels P1, P2, and P3.

The first pixel P1, the second pixel P2, and the third pixel P3 may be arranged in a pixel array having a pentile structure. That is, assuming a virtual quadrangle VS in which the center point CP of the second pixel P2 is the center point of the quadrangle, the first pixel P1 may be at a first vertex Q1 of the virtual quadrangle VS, and the third pixel P3 may be at a second vertex Q2 of the virtual quadrangle VS. The virtual quadrangle VS may be a square.

The first pixel P1 may be apart from the second pixel P2, and the center point of the first pixel P1 may be at the first vertex Q1 of the virtual quadrangle VS. A plurality of first pixels P1 may be provided, and the first pixels P1 may be apart from each other with the second pixel P2 therebetween.

The third pixel P3 may be apart from the first pixel P1 and the second pixel P2, and the center point of the third pixel P3 may be at the second vertex Q2 adjacent to the first vertex Q1 of the virtual quadrangle VS. A plurality of third pixels P3 may be provided, and the third pixels P3 may be apart from each other with the first pixel P1 therebetween.

The first pixels P1 and the third pixels P3 may be alternately arranged in the x direction and the y direction crossing the x direction. The second pixel P2 may be surrounded by the first pixels P1 and the third pixels P3.

Although FIG. 4A illustrates that the arrangement of the first pixel P1, the second pixel P2, and the third pixel P3 has a pentile structure, the invention is not limited thereto.

In an embodiment, the first pixel P1, the second pixel P2, and the third pixel P3 may be arranged in a stripe structure, as illustrated in FIG. 4B. That is, the first pixel P1, the second pixel P2, and the third pixel P3 may be sequentially arranged in the x direction. In another embodiment, the first pixel P1, the second pixel P2, and the third pixel P3 may be arranged in various pixel arrangement structures, such as a mosaic structure and a delta structure. The display apparatus in the illustrated embodiment includes the first pixel P1, the second pixel P2, and the third pixel P3, which emit light of different colors from each other, and openings 510_OP respectively corresponding to the pixels P1, P2, and P3 are defined in the light blocking layer 510.

Hereinafter, the display apparatus in the embodiment will be described in detail according to the stacking order illustrated in FIG. 5.

FIG. 5 is a schematic cross-sectional view of an embodiment of the display apparatus taken along line II-II' of FIG. 4A.

Referring to FIG. 5, the display apparatus in an embodiment may include, on a substrate 100, an organic light-emitting diode OLED with an emission area EA as a display element, a low-reflection inorganic layer 300, a thin-film encapsulation layer 400, a light blocking layer 510 defining an opening 510_OP, and a reflection control layer 530 filling the opening 510_OP. In an embodiment, the display apparatus may further include a capping layer 230 between the organic light-emitting diode OLED and the low-reflection inorganic layer 300.

The substrate 100 may include a single layer of a glass material. In an alternative embodiment, the substrate 100 may include a polymer resin. The substrate 100 including the polymer resin may have a structure in which an inorganic layer and a layer including a polymer resin are stacked. In an embodiment, the substrate 100 may be flexible and may include a polymer resin such as polyethersulfone, polyarylate, polyether imide, polyethylene naphthalate, polyethylene terephthalate, polyphenylene sulfide, polyimide, polycarbonate, cellulose triacetate, and/or cellulose acetate propionate. In an embodiment, the substrate 100 may be rigid and include glass including $SiO_2$ as a main component, or may include a resin such as reinforced plastic.

A thin-film transistor TFT may include a semiconductor layer ACT, a gate electrode GE, a source electrode SE, and a drain electrode DE. The semiconductor layer ACT may include amorphous silicon, polycrystalline silicon, or an organic semiconductor material. In order to secure insulation between the semiconductor layer ACT and the gate electrode GE, a gate insulating layer 203 including an inorganic material such as silicon oxide, silicon nitride, and/or silicon oxynitride may be between the semiconductor layer ACT and the gate electrode GE. Also, an inter-insulating layer 205 including an inorganic material such as silicon oxide, silicon nitride, and/or silicon oxynitride may be on the gate electrode GE, and the source electrode SE and the drain electrode DE may be on the inter-insulating layer 205. The insulating layer including the inorganic material may be formed or provided through chemical vapor deposition ("CVD") or atomic layer deposition ("ALD").

The gate electrode GE, the source electrode SE, and the drain electrode DE may include various conductive materials. In an embodiment, the gate electrode GE may include at least one of molybdenum, aluminum, copper, and titanium and may have a multilayer structure when necessary. In an embodiment, the gate electrode GE may have a single molybdenum layer or a three-layer structure including a molybdenum layer, an aluminum layer, and a molybdenum layer, for example. In an embodiment, the source electrode SE and the drain electrode DE may include at least one of copper, titanium, and aluminum and may have a multilayer structure when necessary. In an embodiment, the source electrode SE and the drain electrode DE may have a three-layer structure including a titanium layer, an aluminum layer, and a titanium layer, for example.

In an embodiment, a buffer layer 201 including an inorganic material such as silicon oxide, silicon nitride, and/or silicon oxynitride may be between the substrate 100 and the thin-film transistor TFT having the above-described structure. The buffer layer 201 may increase the smoothness of the upper surface of the substrate 100, or may prevent or minimize infiltration of impurities from the substrate 100 or the like into the semiconductor layer ACT of the thin-film transistor TFT.

A planarization layer 207 may be on the thin-film transistor TFT. In an embodiment, the planarization layer 207 may include, for example, an organic material such as acryl, benzocyclobutene ("BCB"), or hexamethyldisiloxane ("HMDSO"). Although FIG. 5 illustrates that the planarization layer 207 is a single layer, the planarization layer 207 may be multiple layers.

A pixel electrode 221 may be on the planarization layer 207. The pixel electrode 221 may be arranged for each pixel. The pixel electrodes 221 corresponding to the neighboring pixels may be apart from each other.

In an embodiment, the pixel electrode 221 may include a reflective electrode. In some embodiments, the pixel electrode 221 may include a reflective layer including Ag, Mg, Al, Pt, Pd, Au, Ni, Nd, Ir, Cr, or any combinations thereof, and a transparent or semi-transparent electrode layer on the reflective layer. In an embodiment, the transparent or semi-transparent electrode layer may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In some embodiments, the pixel electrode 221 may have a three-layer structure including an ITO layer, an Ag layer, and an ITO layer.

A pixel defining layer 209 may be on the pixel electrode 221. Openings OP exposing the central portions of the pixel electrodes 221 are defined in the pixel defining layer 209. The pixel defining layer 209 may cover an edge of the pixel electrode 221 and prevent an electric arc or the like from occurring on the edge of the pixel electrode 221 by increasing the distance between the edge of the pixel electrode 221 and an opposite electrode 223. In an embodiment, the pixel defining layer 209 may be formed or provided through spin coating or the like by an organic insulating material such as polyimide, polyamide, acrylic resin, benzocyclobutene, HMDSO, and phenol resin. In an alternative embodiment, the pixel defining layer 209 may include an inorganic insulating material. In an alternative embodiment, the pixel defining layer 209 may have a multilayer structure including an inorganic insulating material and an organic insulating material.

In some embodiments, the pixel defining layer 209 may include a light blocking material and may be black. In an embodiment, the light blocking material may include carbon black, carbon nanotubes, a resin or paste including black dye, metal particles (e.g., nickel, aluminum, molybdenum, and alloys thereof), metal oxide particles (e.g., chromium oxide), or metal nitride particles (e.g., chromium nitride). When the pixel defining layer 209 includes the light blocking material, the reflection of external light caused by metal structures below the pixel defining layer 209 may be reduced.

A spacer 211 may be on the pixel defining layer 209. The spacer 211 may prevent the layers between the substrate 100 and the spacer 211 from being damaged by a mask used in a process of forming an emission layer 222b. The spacer 211 may include the same material as that of the pixel defining layer 209. In some embodiments, the spacer 211 may include a light blocking material.

The emission layer 222b may be arranged inside the opening OP of the pixel defining layer 209. The emission layer 222b may include an organic material including a fluorescent or phosphorescent material capable of emitting red light, green light, or blue light. The above-described organic material may include a low molecular weight organic material or a high molecular weight organic material.

A first common layer 222a and a second common layer 222c may be below and above the emission layer 222b, respectively. In an embodiment, first common layer 222a, the emission layer 222b and the second common layer 222c may be collectively referred to as an intermediate layer 222. The first common layer 222a may include, for example, a hole transport layer ("HTL"), or may include an HTL and a hole injection layer ("HIL"). The second common layer 222c may be on the emission layer 222b, and may include an electron transport layer ("ETL") and/or an electron injection layer ("EIL"). The second common layer 222c is optional. In some embodiments, the second common layer 222c may not be provided.

While the emission layer 222b is arranged for each pixel so as to correspond to the opening OP of the pixel defining layer 209, the first common layer 222a and the second common layer 222c may be each unitary to completely cover the substrate 100, for example, the display area of the substrate 100, like the opposite electrode 223 to be described later.

In an embodiment, the opposite electrode 223 may be a cathode that is an electron injection electrode. In this case, the opposite electrode 223 may include a metal, an alloy, an electrically conductive compound, or any combinations thereof, which has a low work function. The opposite electrode 223 may include a transmissive electrode, a semi-transmissive electrode, or a reflective electrode.

In an embodiment, the opposite electrode 223 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combinations thereof. The opposite electrode 223 may have a single-layer structure having a single layer or a multilayer structure having multiple layers.

The capping layer 230 may improve the external luminescence efficiency of the organic light-emitting diode based on the principle of constructive interference. In an embodiment, the capping layer 230 may include a material having a refractive index of about 1.6 or more (at a wavelength of about 589 nanometers (nm)). In an embodiment, the capping layer 230 may have a thickness of about 1 nm to about 200 nm along a direction perpendicular to a main plane extension direction of the substrate 100, for example, about 5 nm to about 150 nm, or about 10 nm to about 100 nm.

The capping layer 230 may include an organic capping layer including an organic material, an inorganic capping layer including an inorganic material, or a composite capping layer including an organic material and an inorganic material.

In an embodiment, the capping layer 230 may include carbocyclic compounds, heterocyclic compounds, amine group-containing compounds, porphine derivatives, phthalocyanine derivatives, naphthalocyanine derivatives, alkali metal complexes, alkaline earth metal complexes, or any combinations thereof, for example. In an embodiment, the carbocyclic compounds, the heterocyclic compounds, and the amine group-containing compounds may be optionally substituted with a substituent including O, N, S, Se, Si, F, CI, Br, I, or any combinations thereof.

The low-reflection inorganic layer 300 may be on the capping layer 230. The low-reflection inorganic layer 300 may include an inorganic material having a low reflectance. In an embodiment, the low-reflection inorganic layer 300 may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combinations thereof. The low-reflection inorganic layer 300 may be formed or provided by thermally evaporating the inorganic material.

The inorganic material included in the low-reflection inorganic layer 300 may have an absorption coefficient of about 0.5 or more. In an embodiment, the inorganic material included in the low-reflection inorganic layer 300 may have a refractive index of about 1 or more.

The low-reflection inorganic layer 300 may absorb light incident to the inside of the display apparatus and induce destructive interference between metals of an opening, so as to reduce or block light traveling toward the outside of the display apparatus, that is, reduce the reflectance of external light of the display apparatus and improve display quality and visibility.

In an embodiment, the low-reflection inorganic layer 300 may have a thickness of about 0.1 nm to about 50 nm, for example, about 0.5 nm to about 30 nm, or about 1 nm to about 20 nm.

The thin-film encapsulation layer 400 may be on the low-reflection inorganic layer 300. The thin-film encapsulation layer 400 may include at least one inorganic encapsulation layer and at least one organic encapsulation layer. In an embodiment, as illustrated in FIG. 5, the thin-film encapsulation layer 400 may include a first inorganic encapsulation layer 410, an organic encapsulation layer 420, and a second inorganic encapsulation layer 430, for example.

The first inorganic encapsulation layer 410 and the second inorganic encapsulation layer 430 may include one or more inorganic materials of aluminum oxide, titanium oxide, tantalum oxide, hafnium oxide, zinc oxide, silicon oxide, silicon nitride, and silicon oxynitride. The first inorganic encapsulation layer 410 and the second inorganic encapsulation layer 430 may have a single-layer structure or a multilayer structure including the above-described inorganic insulating material.

The organic encapsulation layer 420 may alleviate internal stress of the first inorganic encapsulation layer 410 and/or the second inorganic encapsulation layer 430. The organic encapsulation layer 420 may include a polymer-based material. In an embodiment, the polymer-based material may include polyethylene terephthalate, polyethylene naphthalate, polycarbonate, polyimide, polyethylene sulfonate, polyoxymethylene, polyarylate, hexamethyldisiloxane, acrylic resin (e.g., polymethylmethacrylate, polyacrylic acid, etc.), or any combinations thereof.

In an embodiment, the organic encapsulation layer 420 may be formed or provided by applying a flowable monomer and then curing a monomer layer using heat or light such as ultraviolet light. In an alternative embodiment, the organic encapsulation layer 420 may be formed or provided by applying the above-described polymer-based material.

Even when cracks occur in the thin-film encapsulation layer 400 through the above-described multilayer structure, the thin-film encapsulation layer 400 may prevent the cracks from being connected between the first inorganic encapsulation layer 410 and the organic encapsulation layer 420 or between the organic encapsulation layer 420 and the second inorganic encapsulation layer 430. Therefore, the formation of a path through which external moisture or oxygen penetrates into the display area DA may be prevented or minimized.

The light blocking layer 510 may be on the thin-film encapsulation layer 400. An opening 510_OP overlapping the emission area EA of the organic light-emitting diode OLED is defined in the light blocking layer 510. The emission area EA may be defined by the opening OP of the pixel defining layer 209.

In some embodiments, the opening 510_OP of the light blocking layer 510 may overlap the opening OP of the pixel defining layer 209. A second width W2 of the opening 510_OP of the light blocking layer 510 may be greater than a first width W1 of the opening OP of the pixel defining layer 209.

A body portion of the light blocking layer 510 in which the opening 510_OP is defined may overlap a body portion of the pixel defining layer 209. In an embodiment, the body portion of the light blocking layer 510 may overlap only the body portion of the pixel defining layer 209, for example. The body portion of the light blocking layer 510 is distinguished from the opening 510_OP of the light blocking layer 510 and refers to a portion having a predetermined volume. Similarly, the body portion of the pixel defining layer 209 is distinguished from the opening OP of the pixel defining layer 209 and refers to a portion having a predetermined volume.

In the illustrated embodiment, the light blocking layer 510 may be provided by stacking a first light blocking layer 511 and a second light blocking layer 513. The first light blocking layer 511 and the second light blocking layer 513 have different light absorption wavelength spectra from each other.

In an embodiment, the first light blocking layer 511 may have a wavelength spectrum that absorbs a wavelength in a visible light band of about 380 nm to about 780 nm. In an embodiment, the first light blocking layer 511 may be provided in black. In an embodiment, the first light blocking layer 511 may include carbon black, carbon nanotubes, a resin or paste including black dye, metal particles (e.g., nickel, aluminum, molybdenum, and alloys thereof), metal oxide particles (e.g., chromium oxide), or metal nitride particles (e.g., chromium nitride), for example.

In an embodiment, the second light blocking layer 513 may have a wavelength spectrum that absorbs a wavelength in a blue light band of about 380 nm to about 500 nm. In some embodiments, the second light blocking layer 513 may have a transmittance of 0.5 percent (%) or less with respect to light having a wavelength in a band of about 400 nm to about 490 nm.

In an embodiment, the second light blocking layer 513 may be provided in yellow. In an embodiment, the second light blocking layer 513 may have a material that absorbs a wavelength in a band of about 380 nm to about 500 nm, for example. In an embodiment, the second light blocking layer 513 may include a resin or paste including a yellow dye, for example.

When the absorptance of light of a low wavelength band in a visible light band is high, neutral black may be implemented. In the illustrated embodiment, the first light blocking layer 511 may absorb a wavelength in a visible light band as a whole, and the second light blocking layer 513 may additionally absorb light in a low wavelength band having a high reflectivity, that is, a blue light band. Therefore, the color expressed by the light blocking layer 510 is implemented as neutral black, and thus, the reflectance of external light may be lowered.

The opening 510_OP of the light blocking layer 510 may overlap the opening of the first light blocking layer 511 and the opening of the second light blocking layer 513. The width of the opening 510_OP of the light blocking layer 510 may be defined as the smaller one between the width of the opening of the first light blocking layer 511 and the width of the opening of the second light blocking layer 513. The opening 510_OP of the light blocking layer 510 may be filled with the reflection control layer 530.

The reflection control layer 530 may be on the light blocking layer 510 and fill the opening 510_OP of the light blocking layer 510. That is, the reflection control layer 530 may be on the thin-film encapsulation layer 400 and the body of the light blocking layer 510.

The reflection control layer 530 may selectively absorb light having a wavelength of some bands among light reflected from the display apparatus or light incident from the outside of the display apparatus.

Figure 6:
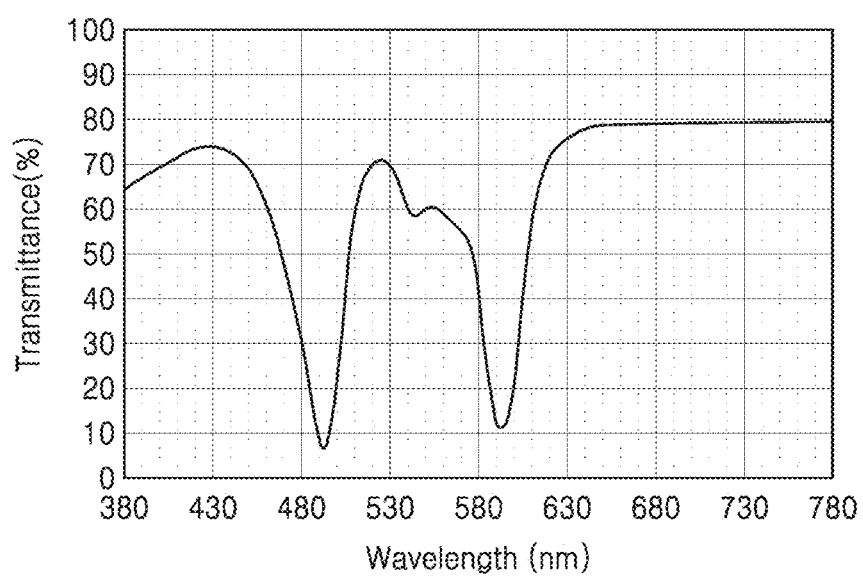
FIG. 6 illustrates transmittance of an embodiment of a reflection control layer.

FIG. 6 illustrates an embodiment of transmittance of the reflection control layer 530. Referring to FIG. 6, the reflection control layer 530 may absorb a first wavelength band of 480 nm to about 505 nm and a second wavelength band of about 585 nm to about 605 nm, so that the transmittance in the first wavelength band and the second wavelength band is 40% or less. That is, the reflection control layer 530 may absorb light having a wavelength that is out of the emission wavelength band of red, green, or blue light of the organic light-emitting diode OLED.

In an embodiment, the reflection control layer 530 may be provided as an organic material layer including a dye, a pigment, or a combination thereof.

In an embodiment, the reflection control layer 530 may include at least one of an oxazine-based compound, a cyanine-based compound, a tetraazaporphyrin-based compound, and a squarylium-based compound.

In an embodiment, the reflection control layer 530 may include a compound represented by one of Formulae 1 to 4 below, for example.

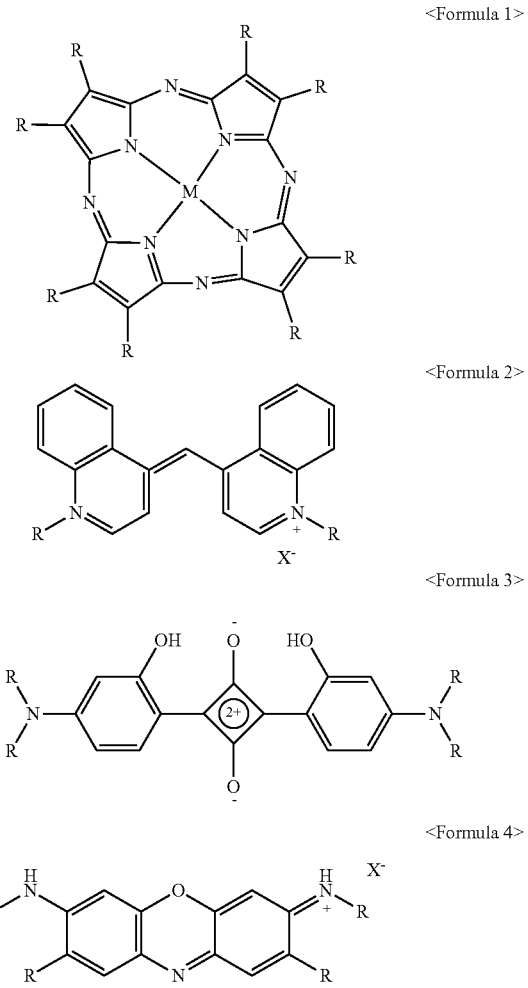

<Formula 1>

<Formula 2>

<Formula 3>

<Formula 4>

In Formulae 1 to 4, M is a metal, $X^-$ is a monovalent anion, and Rs are identical to or different from each other, and may each include hydrogen, deuterium (—D), —F, —Cl, —Br, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combinations thereof; a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combinations thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently include hydrogen; heavy hydrogen; —F;

—Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combinations thereof.

In an embodiment, $X^-$ may be a halide ion, a carboxylate ion, a nitrate ion, a sulfonate ion, or a bisulfate ion.

In an embodiment, $X^-$ may be $F^-$, $Cl^-$, $Br^-$, $I^-$, $CH_3COO^-$, $NO_3^-$, $HSO_4^-$, a propionate ion, a benzene sulfonate ion, or the like, for example.

In an embodiment, the reflectance measured on the surface of the reflection control layer 530 in a specular component included ("SCI") mode may be 10% or less. That is, the reflection control layer 530 may absorb the reflection of external light from the display apparatus, thereby improving visibility.

In order to reduce the reflection of external light, the display apparatus in the illustrated embodiment uses the low-reflection inorganic layer 300 and the reflection control layer 530, instead of a polarizing film or a color filter.

When a polarizing film is used to reduce the reflection of external light, the transmittance of light emitted from the organic light-emitting diode OLED may be remarkably reduced by the polarizing film. When a color filter corresponding to a color of each pixel is used to reduce the reflection of external light, a reflective color band may occur according to different light reflectance for each pixel. Also, because the number of processes increases, the process cost may increase.

The display apparatus in the illustrated embodiment includes the low-reflection inorganic layer 300 and the reflection control layer 530 commonly applied to each pixel, thereby increasing the transmittance and reducing the reflection of external light.

Figure 7:
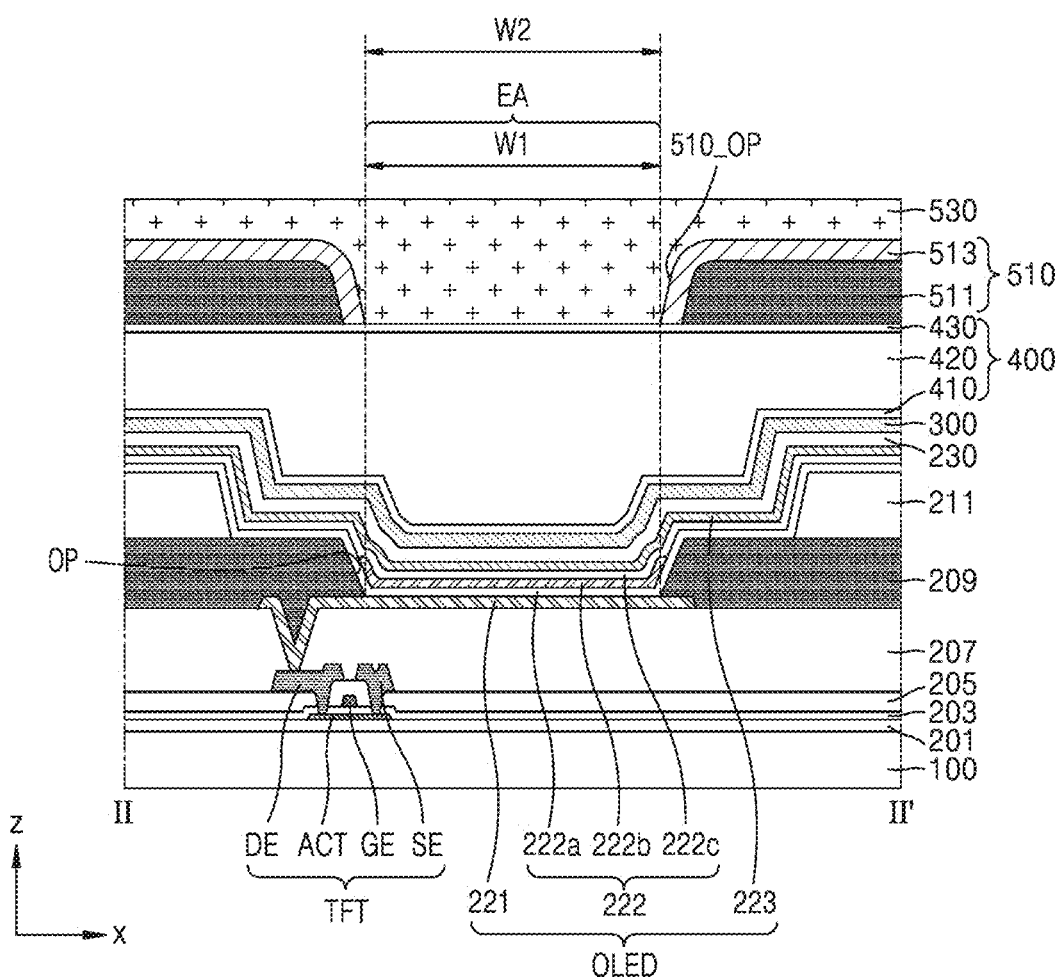
FIG. 7 is a cross-sectional view of an embodiment of a display apparatus.

FIG. 7 is a cross-sectional view of an embodiment of a display apparatus. In FIG. 7, the same reference numerals as those in FIG. 5 denote the same members, and redundant descriptions thereof will be omitted.

Referring to FIG. 7, the display apparatus in an embodiment may include, on a substrate 100, an organic light-emitting diode OLED with an emission area EA as a display element, a low-reflection inorganic layer 300, a thin-film encapsulation layer 400, a light blocking layer 510 defining an opening 510_OP, and a reflection control layer 530 filling the opening 510_OP. In an embodiment, the display apparatus may further include a capping layer 230 between the organic light-emitting diode OLED and the low-reflection inorganic layer 300.

The light blocking layer 510 may be provided by stacking a first light blocking layer 511 and a second light blocking layer 513. The first light blocking layer 511 and the second light blocking layer 513 have different light absorption wavelength spectra from each other.

In an embodiment, the first light blocking layer 511 may have a wavelength spectrum that absorbs a wavelength in a visible light band of about 380 nm to about 780 nm. In an embodiment, the first light blocking layer 511 may be provided in black.

In an embodiment, the second light blocking layer 513 may have a wavelength spectrum that absorbs a wavelength in a blue light band of about 380 nm to about 500 nm. In some embodiments, the second light blocking layer 513 may have a transmittance of 0.5% or less with respect to light having a wavelength in a band of about 400 nm to about 490 nm. In an embodiment, the second light blocking layer 513 may be provided in yellow.

In the illustrated embodiment, the width of the opening of the first light blocking layer 511 may be greater than the width of the opening of the second light blocking layer 513. In an embodiment, the second light blocking layer 513 may cover at least a portion of the side surface of the opening of the first light blocking layer 511, for example.

In this case, the width W2 of the opening 510_OP of the light blocking layer 510 may be defined by the opening of the second light blocking layer 513. In some embodiments, the width W2 of the opening 510_OP of the light blocking layer 510 may be substantially the same as the width W1 of the emission area EA.

The opening 510_OP of the light blocking layer 510 may be filled with the reflection control layer 530. In an embodiment, the reflection control layer 530 may absorb a first wavelength band of about 480 nm to about 505 nm and a second wavelength band of about 585 nm to about 605 nm, so that the transmittance in the first wavelength band and the second wavelength band is about 40% or less. That is, the reflection control layer 530 may absorb light having a wavelength that is out of the emission wavelength band of red, green, or blue light of the organic light-emitting diode OLED.

In an embodiment, the reflection control layer 530 may be provided as an organic material layer including a dye, a pigment, or a combination thereof.

In order to reduce the reflection of external light, the display apparatus in the illustrated embodiment uses the low-reflection inorganic layer 300 and the reflection control layer 530, instead of a polarizing film or a color filter, thereby securing high transmittance.

Also, because the display apparatus in the illustrated embodiment includes the first light blocking layer 511 and the second light blocking layer 513, the color expressed by the light blocking layer 510 is implemented as neutral black. Therefore, the reflectance of external light may be lowered.

Figure 8:
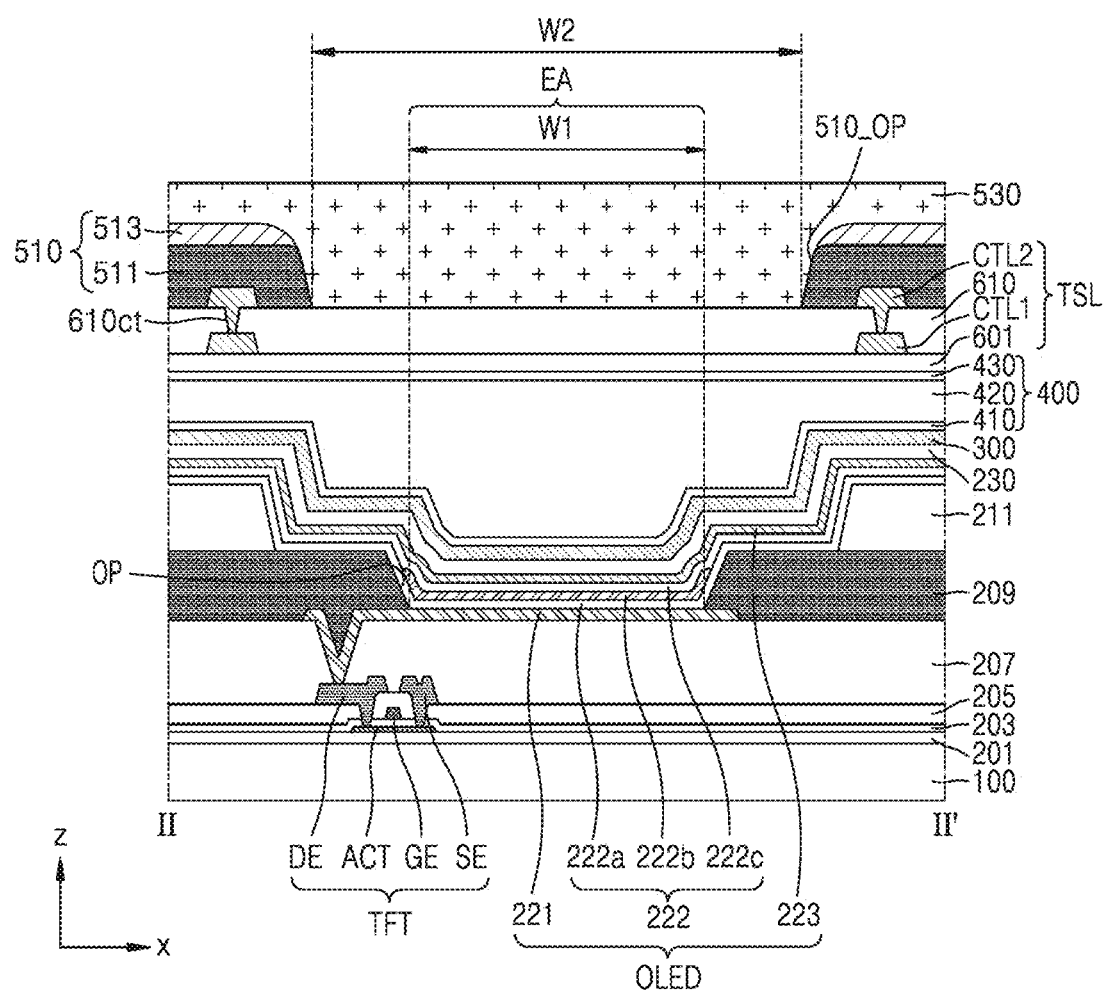
FIG. 8 is a cross-sectional view of an embodiment of a display apparatus.

FIG. 8 is a cross-sectional view of an embodiment of a display apparatus. In FIG. 8, the same reference numerals as those in FIG. 5 denote the same members, and redundant descriptions thereof will be omitted.

Referring to FIG. 8, the display apparatus in an embodiment may include, on a substrate 100, an organic light-emitting diode OLED with an emission area EA as a display element, a low-reflection inorganic layer 300, a thin-film encapsulation layer 400, a light blocking layer 510 defining an opening 510_OP, and a reflection control layer 530 filling the opening 510_OP. In an embodiment, the display apparatus may further include a capping layer 230 between the organic light-emitting diode OLED and the low-reflection inorganic layer 300.

The light blocking layer 510 may be provided by stacking a first light blocking layer 511 and a second light blocking layer 513. The first light blocking layer 511 and the second light blocking layer 513 have different light absorption wavelength spectra from each other.

In the illustrated embodiment, a touch sensing layer TSL may be between the thin-film encapsulation layer 400 and the light blocking layer 510. In an embodiment, the touch sensing layer TSL may sense a user's touch input by at least one of various touch methods such as a resistive method and a capacitive method.

The touch sensing layer TSL is on the thin-film encapsulation layer 400. The touch sensing layer TSL may include first and second sub-conductive layers CTL1 and CTL2 and a touch insulating layer 610. Also, the touch sensing layer TSL may further include a touch buffer layer 601.

The touch buffer layer 601 may be formed or disposed directly on the thin-film encapsulation layer 400. The touch buffer layer 601 may prevent damage to the thin-film encapsulation layer 400 and may block an interference signal that may be generated when the touch sensing layer TSL is driven. In an embodiment, the touch buffer layer 601 may include an inorganic insulating material or an organic material, such as silicon oxide ($SiO_x$), silicon nitride ($SiN_x$), or silicon oxynitride ($SiO_xN_y$), and may include a single layer or multiple layers.

The sub-conductive layer CTL1, the touch insulating layer 610, and the second sub-conductive layer CTL2 may be sequentially stacked on the touch buffer layer 601. The first sub-conductive layer CTL1 and the second sub-conductive layer CTL2 may be below and above the touch insulating layer 610, respectively. In some embodiments, the second sub-conductive layer CTL2 may act as a sensor which detects contact or non-contact, and the first sub-conductive layer CTL1 may act as a connection part connecting the patterned second sub-conductive layer CTL2 in one direction. In another embodiment, the first sub-conductive layer CTL1 may act as a sensor which detects contact or non-contact, and the second sub-conductive layer CTL2 may act as a connection part connecting the patterned first sub-conductive layer CTL1 in one direction.

In some embodiments, both the first sub-conductive layer CTL1 and the second sub-conductive layer CTL2 may act as sensors. In this case, the first sub-conductive layer CTL1 and the second sub-conductive layer CTL2 may be connected to each other through a contact hole 610ct defined in the touch insulating layer 610. As described above, because both the first sub-conductive layer CTL1 and the second sub-conductive layer CTL2 are used as sensors, the resistance of the touch electrode may decrease, and thus, the response speed of the touch sensing layer TSL may be improved.

In some embodiments, the first sub-conductive layer CTL1 and the second sub-conductive layer CTL2 may have a mesh structure so that light emitted from the organic light-emitting diode OLED passes therethrough. Accordingly, the first sub-conductive layer CTL1 and the second sub-conductive layer CTL2 may be arranged not to overlap the emission area EA of the organic light-emitting diode OLED.

The first sub-conductive layer CTL1 and the second sub-conductive layer CTL2 may include a metal layer or a transparent conductive layer, and the metal layer may include molybdenum (Mo), silver (Ag), titanium (Ti), copper (Cu), aluminum (Al), or any alloys thereof. In an embodiment, the transparent conductive layer may include a transparent conductive oxide such as ITO, IZO, zinc oxide (ZnO), and indium tin zinc oxide ("ITZO"). In an embodiment, the transparent conductive layer may include a conductive polymer such as poly(3,4-ethylenedioxythiophene) ("PEDOT"), metal nanowires, carbon nanotubes, or graphene. In an embodiment, each of the first sub-conductive conductive layer CTL1 and the second sub-conductive layer CTL2 may have a three-layer structure including a titanium layer, an aluminum layer, and a titanium layer.

The touch insulating layer 610 may include an inorganic material or an organic material. In an embodiment, the inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. In an embodiment, the organic material may include at least one of an acrylic resin, a methacrylic resin, polyisoprene, a vinyl-based resin, an epoxy-based resin, a urethane-based resin, a cellulose-based resin, and a perylene-based resin.

The light blocking layer 510 and the reflection control layer 530 may be on the touch sensing layer TSL and may reduce the reflection of external light caused by the conductive layer, the first sub-conductive layer CTL1, and the second sub-conductive layer CTL2, which are included in the touch sensing layer TSL.

Figure 9:
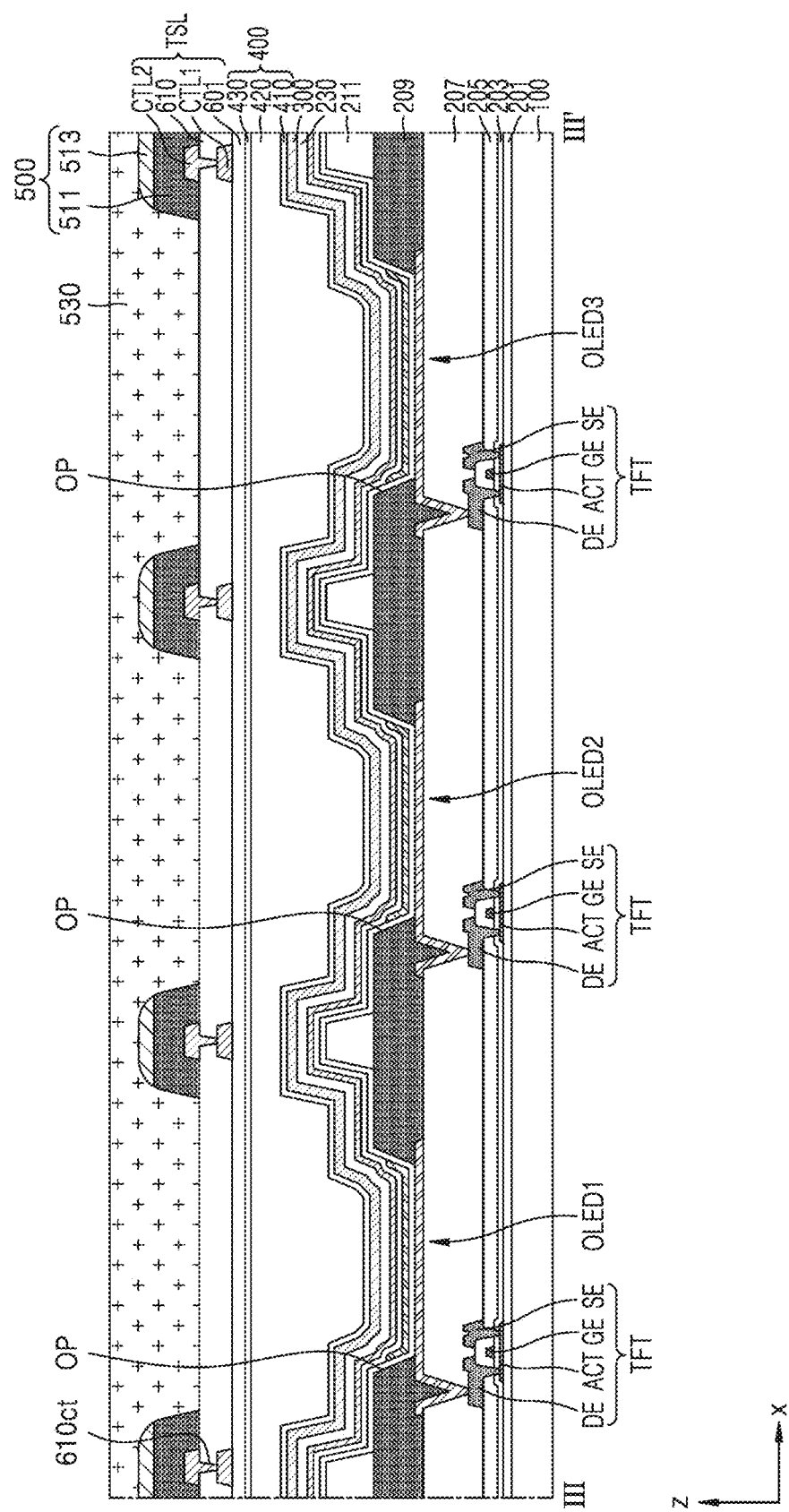
FIG. 9 is a cross-sectional view of an embodiment of a display apparatus taken along line III-III' of FIG. 4A.

FIG. 9 is a cross-sectional view of an embodiment of a display apparatus taken along line III-III' of FIG. 4A. In FIG. 9, the same reference numerals as those in FIG. 8 denote the same members, and redundant descriptions thereof will be omitted.

Referring to FIG. 9, in the display apparatus in an embodiment, a first organic light-emitting diode OLED1, a second organic light-emitting diode OLED2, and a third organic light-emitting diode OLED3, which emit light of different colors from each other, may be on a substrate 100. The display apparatus in an embodiment may include a low-reflection inorganic layer 300 commonly arranged on the first organic light-emitting diode OLED1, the second organic light-emitting diode OLED2, and the third organic light-emitting diode OLED3, a thin-film encapsulation layer 400, a touch sensing layer TSL, a light blocking layer 510 defining an opening 510_OP, and a reflection control layer 530 filling the opening 510_OP. In an embodiment, the display apparatus may further include a capping layer 230 between the organic light-emitting diode OLED and the low-reflection inorganic layer 300.

In an embodiment, the low-reflection inorganic layer 300 may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combinations thereof. The low-reflection inorganic layer 300 may be formed or provided by thermally evaporating the inorganic material.

The inorganic material included in the low-reflection inorganic layer 300 may have an absorption coefficient of 0.5 or more. In an embodiment, the inorganic material included in the low-reflection inorganic layer 300 may have a refractive index of about 1 or more. In an embodiment, the low-reflection inorganic layer 300 may have a thickness of about 0.1 nm to about 50 nm, for example, about 0.5 nm to about 30 nm, or about 1 nm to about 20 nm.

The light blocking layer 510 may be provided by stacking a first light blocking layer 511 and a second light blocking layer 513. The first light blocking layer 511 and the second light blocking layer 513 have different light absorption wavelength spectra from each other. In an embodiment, the first light blocking layer 511 may have a wavelength spectrum that absorbs a wavelength in a visible light band of about 380 nm to about 780 nm. The first light blocking layer 511 may be provided in black. In an embodiment, the second light blocking layer 513 may have a wavelength spectrum that absorbs a wavelength in a blue light band of about 380 nm to about 500 nm. In some embodiments, the second light blocking layer 513 may have a transmittance of 0.5% or less with respect to light having a wavelength in a band of about 400 nm to about 490 nm. In an embodiment, the second light blocking layer 513 may be provided in yellow.

The reflection control layer 530 may be on the light blocking layer 510 (refer to FIG. 8) and fill the opening 510_OP (refer to FIG. 8) of the light blocking layer 510.

That is, the reflection control layer 530 may be on the thin-film encapsulation layer 400 and the body of the light blocking layer 510. The reflection control layer 530 may selectively absorb light having a wavelength of some bands among light reflected from the display apparatus or light incident from the outside of the display apparatus. The reflection control layer 530 may absorb light in two wavelength bands of the visible light band. In an embodiment, the reflection control layer 530 may absorb a first wavelength band of about 480 nm to about 505 nm and a second wavelength band of about 585 nm to about 605 nm, so that the transmittance in the first wavelength band and the second wavelength band is about 40% or less, for example.

The low-reflection inorganic layer 300, the light blocking layer 510, and the reflection control layer 530 may be commonly provided in the first organic light-emitting diode OLED1, the second organic light-emitting diode OLED2, and the third organic light-emitting diode OLED3, which emit light of different colors from each other. The first organic light-emitting diode OLED1 may emit red light, the second organic light-emitting diode OLED2 may emit green light, and the third organic light-emitting diode OLED3 may emit blue light.

The reflection control layers 530 having the same configuration are arranged on the first organic light-emitting diode OLED1, the second organic light-emitting diode OLED2, and the third organic light-emitting diode OLED3, thereby improving the visibility and simplifying the process.

Likewise, the light blocking layers 510 having the same configuration are arranged on the first organic light-emitting diode OLED1, the second organic light-emitting diode OLED2, and the third organic light-emitting diode OLED3.

The first light blocking layer 511 may absorb a wavelength in a visible light band as a whole, and the second light blocking layer 513 may additionally absorb light in a low wavelength band having a high reflectivity, that is, a blue light band. Therefore, the color expressed by the light blocking layer 510 is implemented as neutral black, and thus, the reflectance of external light may be lowered.

Figure 10:
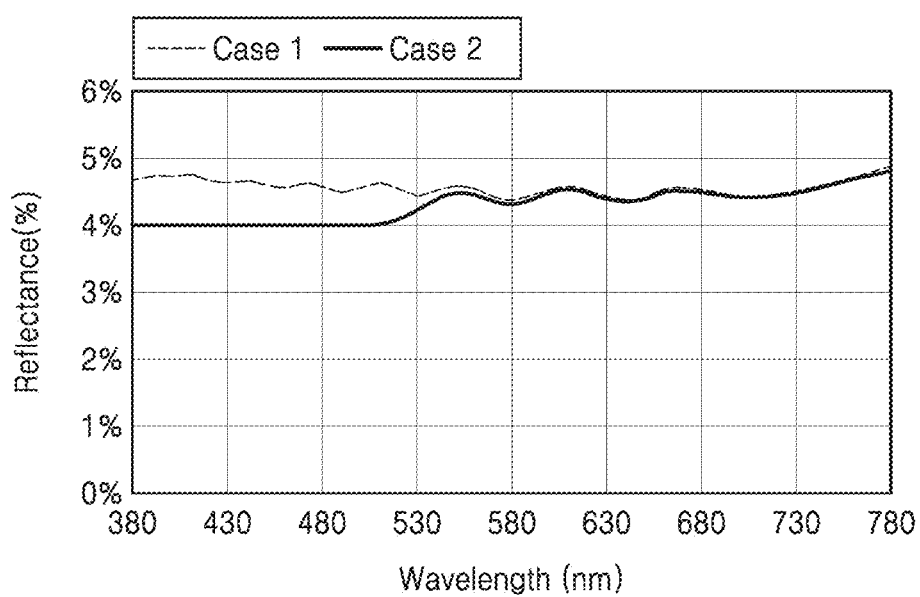
FIG. 10 is a graph showing reflectance of a light blocking layer when the light blocking layer has a single-layer structure and reflectance of a light blocking layer when the light blocking layer has a two-layer structure.

FIG. 10 is a graph showing reflectance of a light blocking layer when the light blocking layer has a single-layer structure and reflectance of a light blocking layer when the light blocking layer has a two-layer structure.

Case 1 shows a case in which the light blocking layer is provided as a single black layer. Case 2 shows a case in which a light blocking layer includes a first light blocking layer provided in black and a second light blocking layer provided in yellow and absorbing blue light are stacked.

Referring to FIG. 10, when comparing the reflectance of the light blocking layer itself, it is confirmed that Case 1 has a high reflectance of 4.5% in a wavelength band of about 380 nm to about 530 nm. Case 2 has a low reflectance of about 4% in a wavelength band of about 380 nm to about 530 nm. Therefore, it is confirmed that the total reflectance of external light by the light blocking layer 510 may be reduced.

Figure 11A:
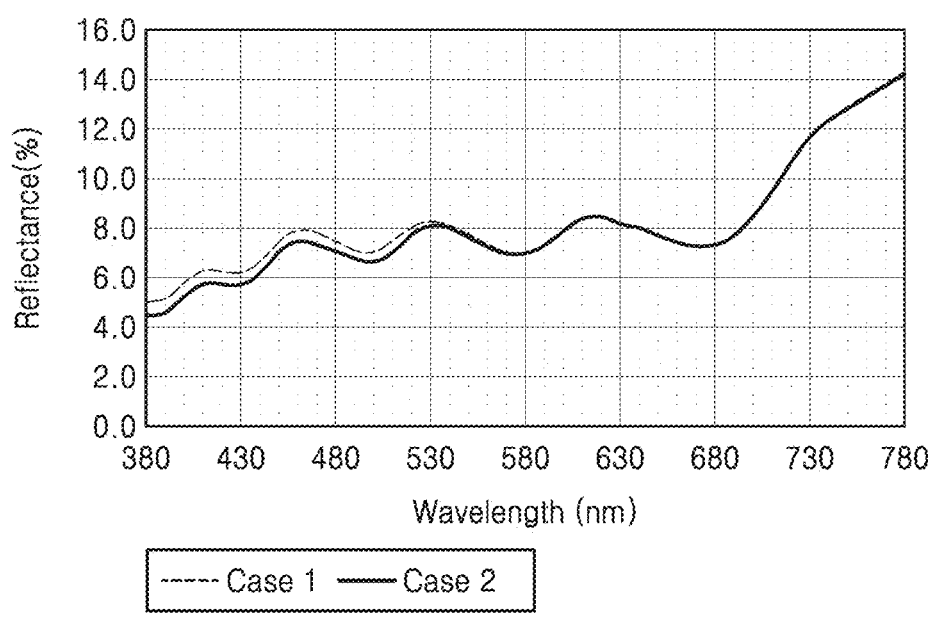
FIGS. 11A and 11B are graphs showing reflectance of a display panel when a light blocking layer has a single-layer structure and reflectance of a display panel when a light blocking layer has a two-layer structure.
Figure 11B:
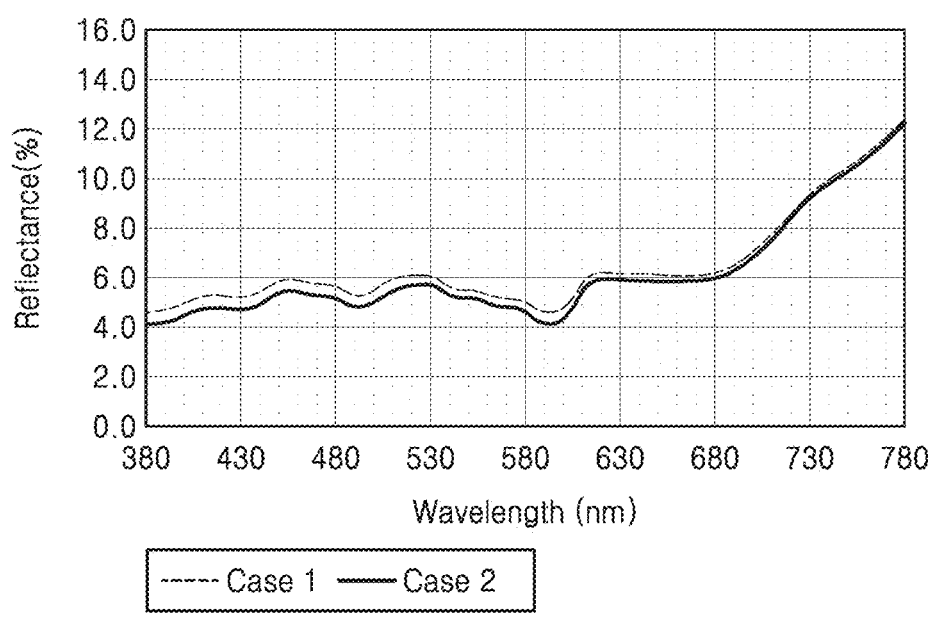

FIGS. 11A and 11B are graphs showing reflectance of a display panel when a light blocking layer has a single-layer structure and reflectance of a display panel when a light blocking layer has a two-layer structure. The display panel of FIG. 11A shows a case in which a reflection control layer is not applied, and the display panel of FIG. 11B shows a case in which a reflection control layer is applied.

Referring to FIGS. 11A and 11B, it is confirmed that the reflectance of external light in the wavelength band of about 380 nm to about 530 nm in the case in which the light blocking layer of Case 2 is applied is lower than that in the case in which the light blocking layer of Case 1 is applied.

Also, when comparing the graphs of FIGS. 11A and 11B, it is confirmed that, when the reflection control layer is applied, the reflectance of external light in the visible light band is generally improved.

As described above, in the display apparatus in the embodiment, the first light blocking layer and the second light blocking layer having different light absorption wavelength spectra from each other are stacked to improve a color sense. Also, the display apparatus in the embodiment may include the low-reflection inorganic layer and the reflection control layer to improve light transmittance and visibility.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
   a substrate;
   a display element on the substrate;
   a low-reflection inorganic layer on the display element;
   a thin-film encapsulation layer on the low-reflection inorganic layer, the thin-film encapsulation layer including a first inorganic layer comprising a material different from the low-reflection inorganic layer;
   a light blocking layer on the thin-film encapsulation layer and defining an opening corresponding to an emission area of the display element, the light blocking layer comprising:
      a first light blocking layer including a black matrix material and disposed on the thin-film encapsulation layer; and
      a second light blocking layer including a yellow material that absorbs blue light and disposed directly on an upper surface of the first light blocking layer; and
   a reflection control layer filling the opening of the light blocking layer.

2. The display apparatus of claim 1, wherein the second light blocking layer covers at least a portion of a side surface of the opening of the first light blocking layer.

3. The display apparatus of claim 1, wherein the reflection control layer selectively absorbs a first wavelength band and a second wavelength band of a visible light band.

4. The display apparatus of claim 3, wherein the first wavelength band is about 480 nanometers to about 505 nanometers, and the second wavelength band is about 585 nanometers to about 605 nanometers.

5. The display apparatus of claim 1, further comprising a pixel defining layer covering an edge of a pixel electrode of the display element and defining an opening exposing a central portion of the pixel electrode,
   wherein the pixel defining layer includes a light blocking material.

6. The display apparatus of claim 1, further comprising a pixel defining layer covering an edge of a pixel electrode of the display element and defining an opening exposing a central portion of the pixel electrode,
   wherein a width of the opening of the light blocking layer is greater than a width of the opening of the pixel defining layer.

7. The display apparatus of claim 1, wherein the low-reflection inorganic layer includes at least one of ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), and germanium (Ge).

8. The display apparatus of claim 1, wherein the reflection control layer includes at least one of a dye and a pigment.

9. The display apparatus of claim 1, further comprising a capping layer between the display element and the low-reflection inorganic layer.

10. The display apparatus of claim 1, further comprising:
a touch sensing layer on the thin-film encapsulation layer,
wherein the light blocking layer is on the touch sensing layer.

11. A display apparatus comprising:
a substrate;
a first display element, a second display element, and a third display element on a substrate;
a low-reflection inorganic layer commonly arranged on the first display element, the second display element, and the third display element;
a thin-film encapsulation layer on the low-reflection inorganic layer, the thin-film encapsulation layer including a first inorganic layer comprising a material different from the low-reflection inorganic layer;
a light blocking layer on the thin-film encapsulation layer and defining openings respectively corresponding to emission areas of the first display element, the second display element, and the third display element, the light blocking layer comprising:
  a first light blocking layer including a black matrix material and disposed on the thin-film encapsulation layer; and
  a second light blocking layer including a yellow material that absorbs blue light and disposed directly on an upper surface of the first light blocking layer; and
a reflection control layer filling the openings of the light blocking layer and commonly arranged on the first display element, the second display element, and the third display element,
wherein the first display element, the second display element, and the third display element emit light of different colors from each other.

12. The display apparatus of claim 11, wherein the reflection control layer selectively absorbs a first wavelength band and a second wavelength band of a visible light band.

13. The display apparatus of claim 12, wherein the first wavelength band is about 480 nanometers to about 505 nanometers, and the second wavelength band is about 585 nanometers to about 605 nanometers.

14. The display apparatus of claim 11, further comprising a pixel defining layer covering edges of pixel electrodes of the first display element, the second display element, and the third display element and defining an opening exposing a central portion of the pixel electrode,
wherein the pixel defining layer includes a light blocking material.

15. The display apparatus of claim 11, wherein the low-reflection inorganic layer includes at least one of ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), and germanium (Ge).

16. The display apparatus of claim 11, wherein the reflection control layer includes at least one of a dye and a pigment.

17. The display apparatus of claim 11, further comprising:
a touch sensing layer on the thin-film encapsulation layer,
wherein the light blocking layer is on the touch sensing layer.

* * * * *